US010008556B2

(12) United States Patent
Choung

(10) Patent No.: US 10,008,556 B2
(45) Date of Patent: Jun. 26, 2018

(54) ORGANIC LIGHT-EMITTING DISPLAY DEVICE

(71) Applicant: SAMSUNG DISPLAY CO., LTD., Yongin-si, Gyeonggi-do (KR)

(72) Inventor: Jiyoung Choung, Yongin (KR)

(73) Assignee: Samsung Display Co., Ltd., Yongin-si, Gyeonggi-do (KR)

( * ) Notice: Subject to any disclaimer, the term of this patent is extended or adjusted under 35 U.S.C. 154(b) by 0 days. days.

(21) Appl. No.: 15/245,881

(22) Filed: Aug. 24, 2016

(65) Prior Publication Data
US 2017/0373132 A1    Dec. 28, 2017

(30) Foreign Application Priority Data

Jun. 27, 2016  (KR) .................. 10-2016-0080246

(51) Int. Cl.
H01L 27/32        (2006.01)
H01L 51/52        (2006.01)

(52) U.S. Cl.
CPC ...... H01L 27/3279 (2013.01); H01L 51/5228 (2013.01)

(58) Field of Classification Search
CPC .................................................. H01L 27/3279
See application file for complete search history.

(56) References Cited

U.S. PATENT DOCUMENTS

| 8,643,267 | B2 | 2/2014 | Matsuura et al. |
| 8,809,111 | B2 | 8/2014 | Ober et al. |
| 8,823,257 | B2 | 9/2014 | Fujita et al. |
| 8,846,301 | B2 | 9/2014 | Ober et al. |
| 9,245,939 | B2 | 1/2016 | Ono et al. |
| 2003/0038589 | A1 | 2/2003 | Kim et al. |
| 2013/0236999 | A1 | 12/2013 | Lee et al. |
| 2014/0127625 | A1 | 5/2014 | Defranco et al. |
| 2014/0175390 | A1 | 6/2014 | Kim et al. |

FOREIGN PATENT DOCUMENTS

| KR | 10-2002-0059535 A | 7/2002 |
| KR | 2003-0017695 | 3/2003 |
| KR | 10-2007-0037091 A | 4/2007 |

Primary Examiner — Douglas Menz
(74) Attorney, Agent, or Firm — Lee & Morse, P.C.

(57) ABSTRACT

An organic light-emitting display device includes a substrate including a display area and a peripheral area surrounding the display area. The display area includes a plurality of pixel regions including a plurality of pixels including pixel electrodes and non-pixel regions between the pixel regions. The pixel electrodes are spaced apart from each other, with a pixel-defining layer above the plurality of pixel electrodes and exposing the plurality of pixel electrodes. A plurality of intermediate layers respectively above the plurality of pixel electrodes include an emission layer. A plurality of opposite electrodes respectively face the plurality of pixel electrodes and are spaced apart from each other. A plurality of connection electrodes that connect the plurality of opposite electrodes are in the non-pixel regions. A power line electrically connected to at least one of the plurality of connection electrodes is in the peripheral area.

20 Claims, 17 Drawing Sheets ic # ORGANIC LIGHT-EMITTING DISPLAY DEVICE

CROSS-REFERENCE TO RELATED APPLICATION

Korean Patent Application No. 10-2016-0080246, filed on Jun. 27, 2016, in the Korean Intellectual Property Office, and entitled: "Organic Light-Emitting Display Device," is incorporated by reference herein in its entirety.

BACKGROUND

1. Field

One or more embodiments relate to an organic light-emitting display device.

2. Description of the Related Art

An organic light-emitting display device is a display device in which each of pixels includes an organic light-emitting diode (OLED). The OLED includes a pixel electrode, an opposite electrode facing the pixel electrode, and an emission layer between the pixel electrode and the opposite electrode.

SUMMARY

Embodiments are directed to an organic light-emitting display device including a substrate including a display area and a peripheral area, the display area including a plurality of pixel regions and non-pixel regions between the pixel regions, and the peripheral area surrounding the display area, a plurality of pixel electrodes respectively in the pixel regions, the pixel electrodes being spaced apart from each other, a pixel-defining layer above the plurality of pixel electrodes, the pixel-defining layer exposing the plurality of pixel electrodes, a plurality of intermediate layers respectively above the plurality of pixel electrodes, the intermediate layers including an emission layer, a plurality of opposite electrodes respectively facing the plurality of pixel electrodes and spaced apart from each other, a plurality of connection electrodes in the non-pixel regions, the connection electrodes connecting the plurality of opposite electrodes, and a power line in the peripheral area, the power line being electrically connected to at least one of the plurality of connection electrodes.

The plurality of connection electrodes may be above the pixel-defining layer.

The plurality of connection electrodes may include a same material as the plurality of opposite electrodes.

The organic light-emitting display device may further include a conductive layer connecting at least one connection electrode to the power line.

The conductive layer may be above the power line and the at least one connection electrode.

The organic light-emitting display device may further include a dummy intermediate layer below the at least one connection electrode. The dummy intermediate layer may include a same material as the intermediate layer.

The plurality of opposite electrodes may include a plurality of first opposite electrodes corresponding to a first pixel region and a plurality of second opposite electrodes corresponding to a second pixel region. The plurality of connection electrodes may include a first connection electrode connecting the plurality of first opposite electrodes and a second connection electrode connecting the plurality of second opposite electrodes.

The first connection electrode may cross the second connection electrode in the non-pixel region.

The organic light-emitting display device may further include an organic material between the first connection electrode and the second connection electrode.

The organic material may include a same material as one of a first intermediate layer corresponding to the first pixel region and a second intermediate layer corresponding to the second pixel region.

The plurality of connection electrodes may be below the pixel-defining layer.

The pixel-defining layer may include contact holes passing through the pixel-defining layer and respectively exposing the plurality of connection electrodes. The plurality of opposite electrodes may be connected to the plurality of connection electrodes via the contact holes.

The plurality of connection electrodes may include a same material as the plurality of pixel electrodes.

The plurality of opposite electrodes may include a plurality of first opposite electrodes corresponding to a first pixel region and a plurality of second opposite electrodes corresponding to a second pixel region. At least one of the plurality of connection electrodes may connect the first opposite electrodes to the second opposite electrodes.

The power line may be lower than the plurality of pixel electrodes in a direction toward the substrate.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
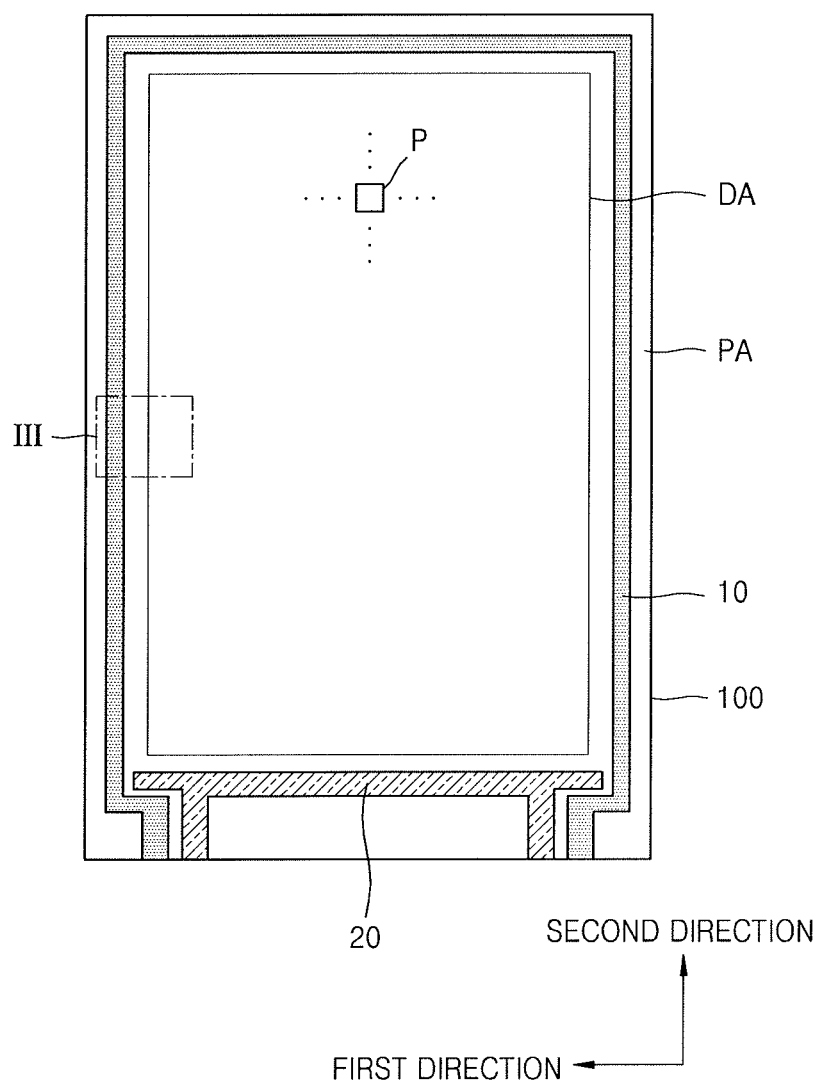
FIG. 1 illustrates a plan view of an organic light-emitting display device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "between" two layers, it can be the only layer between the two layers, or one or more intervening layers may also be present. Like reference numerals refer to like elements throughout.

FIG. 1 illustrates a plan view of an organic light-emitting display device 1 according to an embodiment.

Referring to FIG. 1, the organic light-emitting display device 1 may include a substrate 100. The substrate 100 may include a display area DA and a peripheral area PA surrounding the display area DA.

Pixels including an organic light-emitting diode (OLED) may be in the display area DA of the substrate 100. In some implementations, pixels P may include a red pixel, a green pixel, and a blue pixel. In some implementations, the pixels P may include a red pixel, a green pixel, a blue pixel, and a white pixel. The pixels P may provide an image by emitting light having a predetermined brightness.

The peripheral area PA is an area in which an image is not produced. A driver and wirings transferring an electric signal to be applied to the display area DA may be in the peripheral area PA. For example, a first power line 10 for supplying a common power voltage ELVSS to an OLED, and a second power line 20 for supplying a driving voltage ELVDD may be in the peripheral area PA. Also, a scan driver that drives a pixel P and a data driver may be in the peripheral area PA.

Figure 2A:
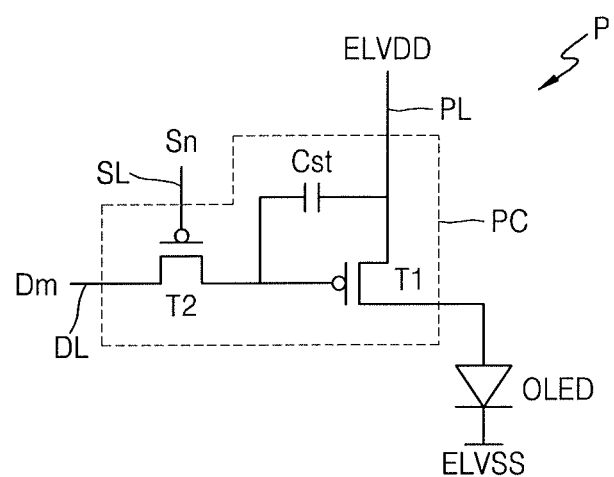
FIGS. 2A and 2B illustrate equivalent circuit diagrams of one of pixels of an organic light-emitting display device according to an embodiment.
Figure 2B:
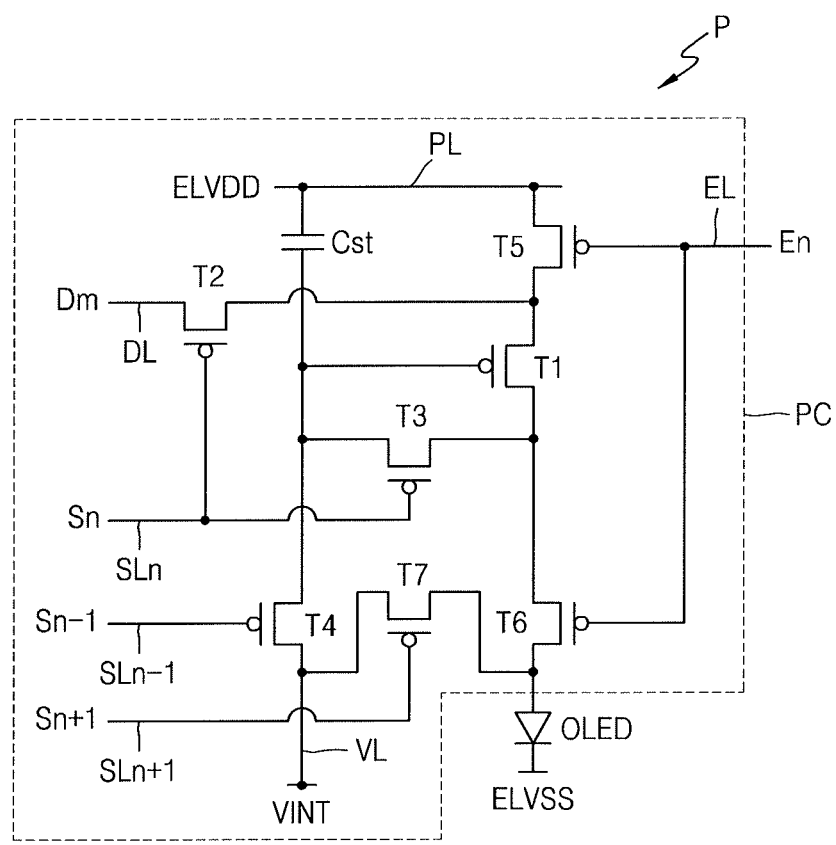

FIGS. 2A and 2B illustrate equivalent circuit diagrams of one of pixels of an organic light-emitting display device according to an embodiment.

Referring to FIG. 2A, each pixel P may include a pixel circuit connected to a scan line SL and a data line DL, and an OLED connected to the pixel circuit PC.

The pixel circuit PC may include a driving thin film transistor (TFT) T1, a switching TFT T2, and a storage capacitor Cst. The switching TFT T2 may be connected to the scan line SL and the data line DL. The switching TFT T2 may transfer a data signal Dm input via the data line DL to the driving TFT T1.

The storage capacitor Cst may be connected to the switching TFT T2 and a driving voltage line PL. The storage capacitor Cst may store a voltage corresponding to a difference between a voltage transferred from the switching TFT T2 and a driving voltage ELVDD supplied to the driving voltage line PL.

The driving TFT T1 may be connected to the driving voltage line PL and the storage capacitor Cst. The driving TFT T1 may control a driving current flowing through the OLED from the driving voltage line PL in response to a voltage value stored in the storage capacitor Cst. The OLED may emit light having predetermined brightness by using the driving current.

Though FIG. 2A describes a case where a pixel P includes two TFTs and one storage capacitor, the number of these component may vary.

Referring to FIG. 2B, the pixel circuit PC may include the driving and switching TFTs T1 and T2, a compensation TFT T3, a first initialization TFT T4, a first emission control TFT T5, a second emission control TFT T6, and a second initialization TFT T7.

A drain electrode of the driving TFT T1 may be electrically connected to the OLED via the second emission control TFT T6. The driving TFT T1 may receive a data signal Dm in response to a switching operation of the switching TFT T2 and may supply the driving current to the OLED.

A gate electrode of the switching TFT T2 may be connected to a first scan line SLn, and a source electrode of the switching TFT T2 may be connected to the data line DL. A drain electrode of the switching TFT T2 may be connected to a source electrode of the driving TFT T1 and connected to the driving voltage line PL via the first emission control TFT T5.

The switching TFT T2 may be turned-on in response to a first scan signal Sn transferred via the first scan line SLn and may perform a switching operation of transferring a data signal Dm transferred via the data line DL to the source electrode of the driving TFT T1.

A gate electrode of the compensation TFT T3 may be connected to the first scan line SLn. A source electrode of the compensation TFT T3 may be connected to the drain electrode of the driving TFT T1 and connected to a pixel electrode of the OLED via the second emission control TFT T6. A drain electrode of the compensation TFT T3 may be connected to one of electrodes of the storage capacitor Cst, a source electrode of the first initialization TFT T4, and a gate electrode of the driving TFT T1 together. The compensation TFT T3 may be turned on in response to a first scan signal Sn transferred via the first scan line SLn and may diode-connect the driving TFT T1 by connecting the gate electrode of the driving TFT T1 to the drain electrode of the driving TFT T1.

A gate electrode of the first initialization TFT T4 may be connected to a second scan line SLn−1. A drain electrode of the first initialization TFT T4 may be connected to an initialization voltage line VL. A source electrode of the first initialization TFT T4 may be connected to one of the electrodes of the storage capacitor Cst, the drain electrode of the compensation TFT T3, and the gate electrode of the driving TFT T1 together. The first initialization TFT T4 may be turned on in response to a second scan signal Sn−1 transferred via a second scan line SLn−1 and may perform an initialization operation of initializing a voltage of the gate electrode of the driving TFT T1 by transferring an initialization voltage VINT to the gate electrode of the driving TFT T1.

A gate electrode of the first emission control TFT T5 may be connected to an emission control line EL. A source electrode of the first emission control TFT T5 may be connected to the driving voltage line PL. A drain electrode of the first emission control TFT T5 may be connected to the source electrode of the driving TFT T1 and the drain electrode of the switching TFT T2.

A gate electrode of the second emission control TFT T6 may be connected to the emission control line EL. A source electrode of the second emission control TFT T6 may be connected to the drain electrode of the driving TFT T1 and the source electrode of the compensation TFT T3. A drain electrode of the second emission control TFT T6 may be electrically connected to the pixel electrode of the OLED. The first emission control TFT T5 and the second emission control TFT T6 may be simultaneously turned on in response to an emission control signal En transferred via the emission control line EL such that a driving voltage ELVDD is transferred to the OLED, and the driving current flows through the OLED.

A gate electrode of the second initialization TFT T7 may be connected to a third scan line SLn+1. A source electrode of the second initialization TFT T7 may be connected to the pixel electrode of the OLED. A drain electrode of the second initialization TFT T7 may be connected to the initialization voltage line VL. The second initialization TFT T7 may be turned-on in response to a third scan signal Sn+1 transferred via the third scan line SLn+1 and may initialize the pixel electrode of the OLED.

The other of the electrodes of the storage capacitor Cst may be connected to the driving voltage line PL. One of the electrodes of the storage capacitor Cst may be connected to the gate electrode of the driving TFT T1, the drain electrode of the compensation TFT T3, and the source electrode of the first initialization TFT T4 together.

An opposite electrode of the OLED may be connected to a common power voltage ELVSS. The OLED may receive the driving current from the driving TFT T1 and may emit light.

The number of TFTs and storage capacitors and the circuit design of the pixel circuit PC described with reference to FIGS. 2A and 2B, and may be changed variously.

Figure 3:
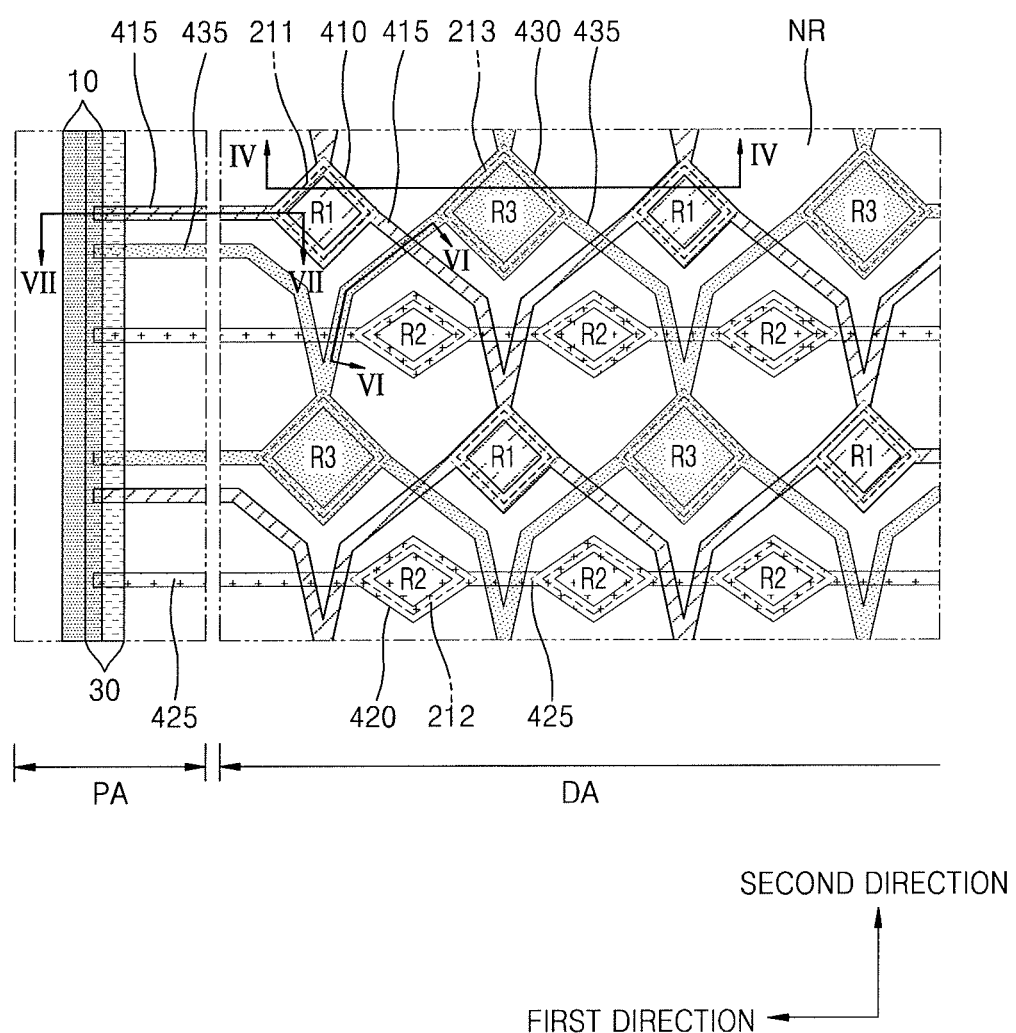
FIG. 3 illustrates an enlarged plan view of a portion III of FIG. 1.
Figure 4:
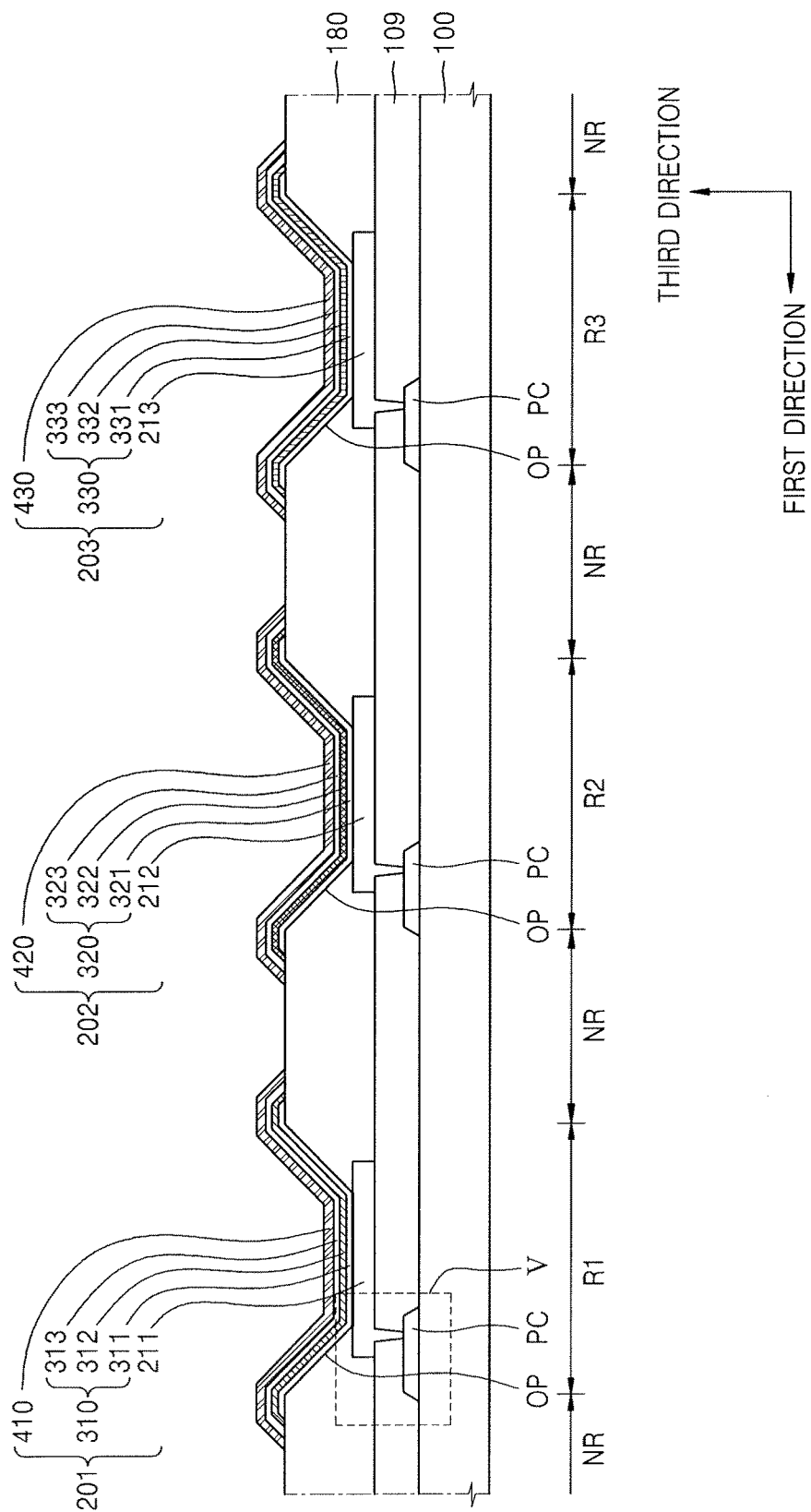
FIG. 4 illustrates a cross-sectional view of the pixel, taken along a line IV-IV of FIG. 3.
Figure 5A:
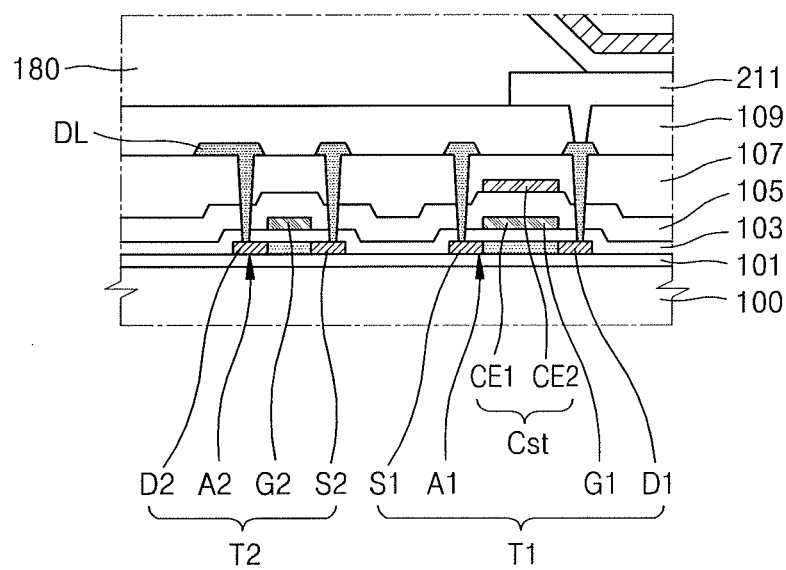
FIGS. 5A and 5B illustrate enlarged cross-sectional views of a portion V of FIG. 4.
Figure 5B:
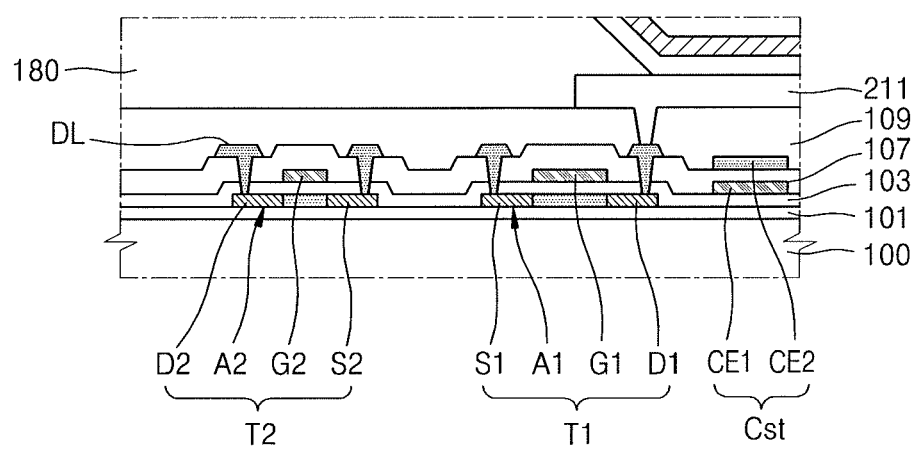
Figure 6:
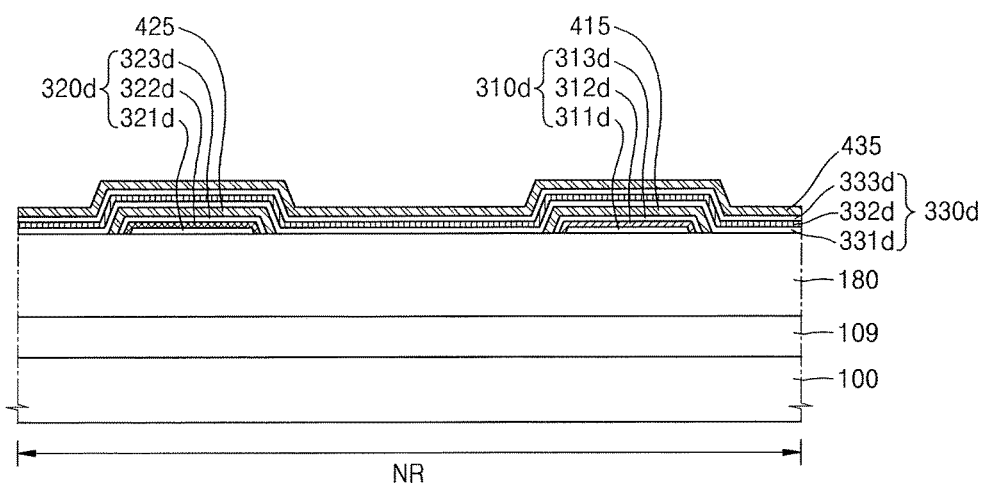
FIG. 6 illustrates a cross-sectional view of the pixel, taken along a line VI-VI of FIG. 3.
Figure 7:
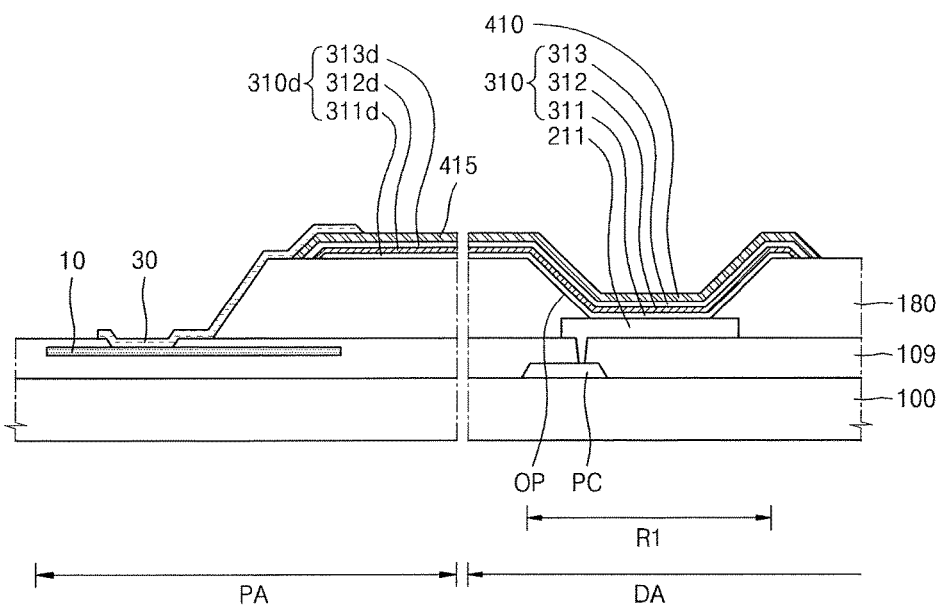
FIG. 7 illustrates a cross-sectional view of the pixel, taken along a line VII-VII of FIG. 3.

FIG. 3 illustrates an enlarged plan view of a portion III of FIG. 1, FIG. 4 illustrates a cross-sectional view of a pixel, taken along a line IV-IV of FIG. 3, FIGS. 5A and 5B illustrate enlarged cross-sectional views of a portion V of FIG. 4, FIG. 6 illustrates a cross-sectional view of the pixel, taken along a line VI-VI of FIG. 3, FIG. 7 illustrates a cross-sectional view of the pixel, taken along a line VII-VII of FIG. 3, and FIGS. 8A to 8C, 9A, and 9B illustrate a stages of processes of manufacturing an intermediate layer and an opposite electrode according to embodiments.

Referring to FIGS. 3 and 4, the display area DA may include pixel regions R1, R2, and R3 respectively corresponding to the pixels P described with reference to FIG. 1 and non-pixel regions NR between the pixel regions R1, R2, and R3. Hereinafter, for convenience of description, a case where the pixels P include a red pixel, a green pixel, and a blue pixel and thus, where the display area DA includes the first red pixel region R1, the second green pixel region R2, and the third blue pixel region R3, is described.

First to third OLEDs 201, 202, and 203 may respectively be in the first to third pixel regions R1, R2, and R3. The first to third OLEDs 201, 202, and 203 may be connected to pixel circuits PC respectively provided to the pixels P.

For example, as shown in FIG. 3, pixels R1 and R3 may alternate in first and second directions. Pixels R2 may be provided in rows in the first direction between the rows of pixels R1 and R3. Each pixel may have a rhombus shape. The pixels R3 may be bigger than the pixels R1 and the pixels R2.

As illustrated in FIG. 5A, the pixel circuit PC may include the driving TFT T1 including a driving semiconductor layer A1 including a driving source region S1 and a driving drain region D1, and a driving gate electrode G1, the switching TFT T2 including a switching semiconductor layer A2 including a switching source region S2 and a switching drain region D2, and a switching gate electrode G2, and the storage capacitor Cst including first and second storage plates CE1 and CE2. A buffer layer 101 may be between the substrate 100 and the driving and switching semiconductor layers A1 and A2, a gate insulating layer 103 may be between the driving and switching semiconductor layers A1 and A2 and the driving and switching gate electrodes G1 and G2. A dielectric layer 105 may be between the first and second storage plates CE1 and CE2. An insulating layer 109 may be below a pixel electrode, for example, a first pixel electrode 211.

The substrate 100 may include various materials such as a glass material or a plastic material including polyethylene terephthalate (PET), polyethylene naphthalate (PEN), polyimide, etc. In the case where the substrate 100 includes a plastic material, flexibility of the substrate 100 may improve compared with a case where the substrate 100 includes a glass material. The buffer layer 101 and the gate insulating layer 103 may be a single layer or multiple layers including an inorganic material such as SiNx and/or SiOx The dielectric layer 105 may be a single layer or multiple layers including an inorganic material such as SiOx, SiNx, and/or $Al_2O_3$. The insulating layer 109 may include an organic material including a general-purpose polymer such as polymethylmethacrylate (PMMA) or polystyrene (PS), a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof, as examples.

In the pixel circuit PC, as illustrated in FIG. 5A, the first storage plate CE1 and the driving gate electrode G1 may be in the same layer and the storage capacitor Cst may overlap the driving TFT T1. In some implementations, as illustrated in FIG. 5B, the storage capacitor Cst may not overlap the driving TFT T1. Though FIGS. 5A and 5B illustrate the pixel circuit PC connected to the first pixel electrode 211, pixel circuits PC connected to second and third pixel electrodes 212 and 213 may have the same structure as understood by a person of ordinary skill in the art.

Referring to FIGS. 3 and 4 again, the first OLED 201 may include the first pixel electrode 211, a first intermediate layer 310, and a first opposite electrode 410. The second OLED 202 may include the second pixel electrode 212, a second intermediate layer 320, and a second opposite electrode 420. The third OLED 203 may include the third pixel electrode 213, a third intermediate layer 330, and a third opposite electrode 430.

The first to third pixel electrodes 211, 212, and 213 may be island-type electrodes respectively corresponding to the first to third pixel regions R1, R2, and R3 and may be spaced apart from each other.

The first to third pixel electrodes 211, 212, and 213 may be reflective electrodes or optically clear electrodes. In the case where the first to third pixel electrodes 211, 212, and 213 are reflective electrodes, the first to third pixel electrodes 211, 212, and 213 may include a reflective layer including Ag, Mg, Al, Pt, Pd, Au, Ni, Nd, Ir, Cr, or a compound thereof. In some implementations, the first to third pixel electrodes 211, 212, and 213 may include a reflective layer and a transparent conductive oxide (TCO) layer above and/or below the reflective layer.

In the case where the first to third pixel electrodes 211, 212, and 213 are optically clear electrodes, the first to third pixel electrodes 211, 212, and 213 may be TCO layers. In some implementations, the first to third pixel electrodes 211, 212, and 213 may be metallic thin films including Ag or an Ag alloy, or may be layers including TCO layers above the metallic thin films. In some implementations, the first to third pixel electrodes 211, 212, and 213 may be three layers of ITO/Ag/ITO sequentially having thicknesses of about 70 Å/850 Å/50 Å.

A pixel-defining layer 180 may be above the first to third pixel electrodes 211, 212, and 213. The pixel-defining layer 180 may expose the first to third pixel electrodes 211, 212, and 213 via openings OP. The pixel-defining layer 180 may include an organic insulating material and an inorganic insulating material, or include an inorganic insulating material.

The first to third intermediate layers 310, 320, and 330 may be above the first to third pixel electrodes 211, 212, and 213 exposed via the pixel-defining layer 180. The first to third intermediate layers 310, 320, and 330 may respectively correspond to the first to third pixel regions R1, R2, and R3 and may be spaced apart from each other.

The first intermediate layer 310 may include a first emission layer 312 that emits red light, the second intermediate layer 320 may include a second emission layer 322 that emits green light, and the third intermediate layer 330 may include a third emission layer 332 that emits blue light. The first to third emission layers 312 to 332 may include a low molecular organic material or a polymer organic material.

Each of the first to third intermediate layers 310, 320, and 330 may further include at least one of first functional layers 311, 321, 331 and second functional layers 313, 323, 333. The first functional layers 311, 321, 331 may include a hole injection layer (HIL) and/or a hole transport layer (HTL). The second functional layers 313, 323, 333 may include an electron transport layer (ETL) and/or an electron injection layer (EIL).

The first to third opposite electrodes 410, 420, and 430 may respectively correspond to the first to third pixel regions R1, R2, and R3 and may be spaced apart from each other. The first to third opposite electrodes 410, 420, and 430 may respectively face the first to third pixel electrodes 211, 212, and 213 with the first to third intermediate layers 310, 320, and 330 disposed therebetween in a thickness direction (a third direction).

The first to third opposite electrodes 410, 420, and 430 may be respectively formed during the same mask process as the first to third intermediate layers 310, 320, and 330. The first intermediate layer 310 and the first opposite electrode 410 may be formed during the same mask process, the second intermediate layer 320 and the second opposite electrode 420 may be formed during the same mask process, and the third intermediate layer 330 and the third opposite electrode 430 may be formed during the same mask process.

Figure 8A:
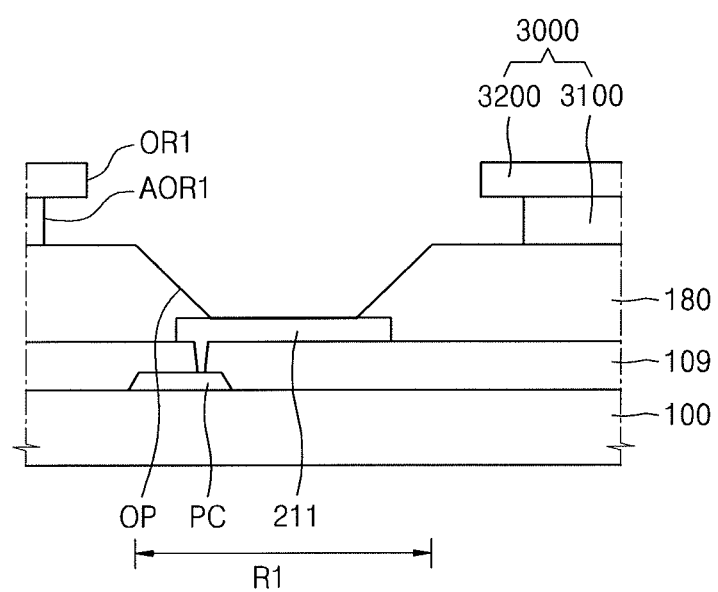
FIGS. 8A to 8C, 9A and 9B illustrate stages of a process of manufacturing an intermediate layer and an opposite electrode according to an embodiment.
Figure 8B:
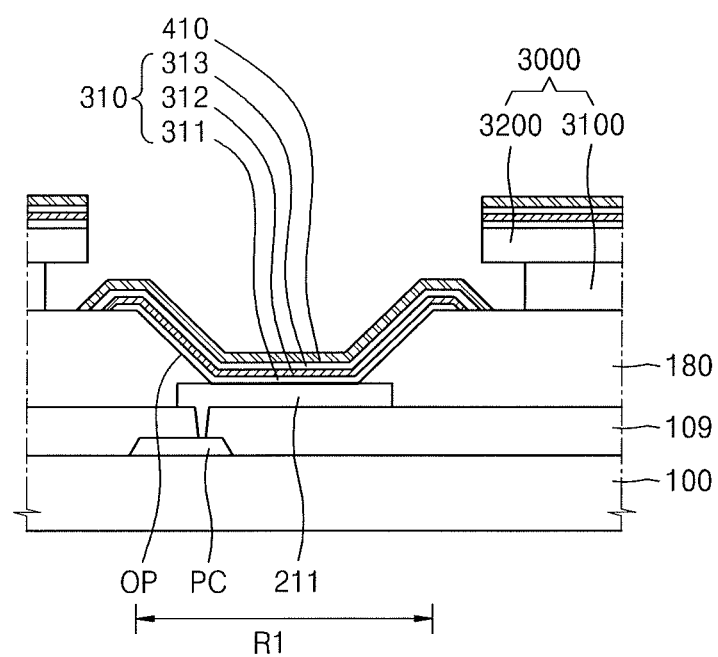
Figure 8C:
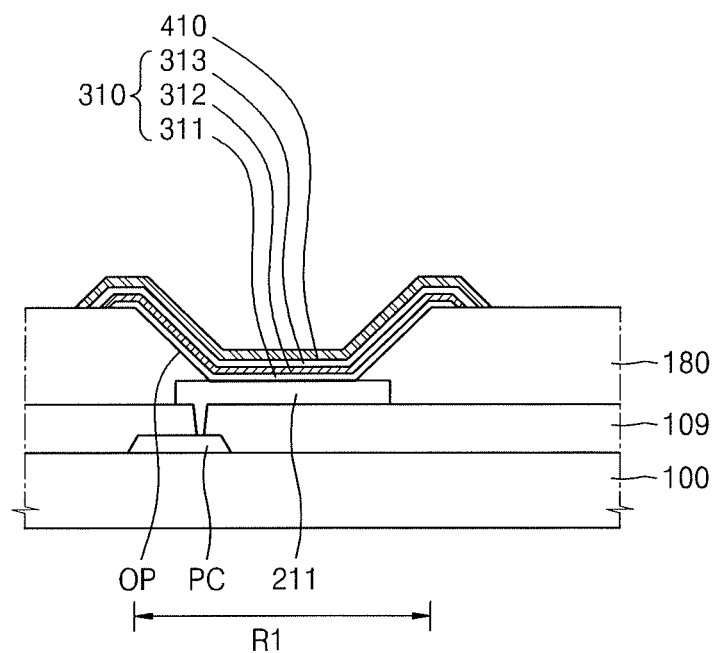

As an embodiment, as illustrated in FIG. 8A, a first masking pattern 3000 including an opening region corresponding to the first pixel region R1 may be formed above the pixel-defining layer 180. Subsequently, when forming the first intermediate layer 310 and the first opposite electrode 410 by using a thermal evaporation method, etc. and removing the first masking pattern 3000 as illustrated in FIG. 8B, a stacked structure of patterned first intermediate layer 310 and first opposite electrode 410 may remain in the first pixel region R1 as illustrated in FIG. 8C. The first masking pattern 3000 may include a first photoresist layer 3200 and a mediation layer 3100 below the photoresist layer 3200. The mediation layer 3100 may include a resin material such as a fluorine-based resin, etc. An opening AOR1 of the mediation layer 3100 may be greater than an opening region OR1 of the first photoresist layer 3200. The first opposite electrode 410 may extend and cover an end of the first intermediate layer 310 in an incident direction of a thermally evaporated material. As an embodiment, the first opposite electrode 410 may have a forward tapered shape and may contact the pixel-defining layer 180.

A stacked structure of the patterned second intermediate layer 320 and second opposite electrode 420 may be formed in the second pixel region R2 by using the same method described above. For example, after forming a second masking pattern including an opening region corresponding to the second pixel region R2 above the pixel-defining layer 180, when forming the second intermediate layer 320 and the second opposite electrode 420 by using the thermal evaporation method, etc. and removing the second masking pattern, a stacked structure of patterned second intermediate layer 320 and second opposite electrode 420 may remain in the second pixel region R2. Similarly, a stacked structure of a patterned third intermediate layer 330 and third opposite electrode 430 may be formed in the third pixel region R3 using a third masking pattern.

Figure 9A:
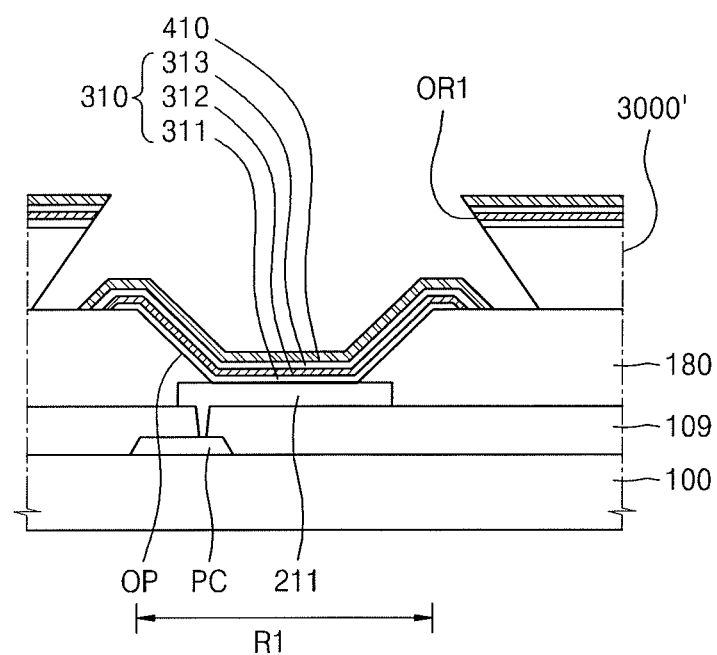
Figure 9B:
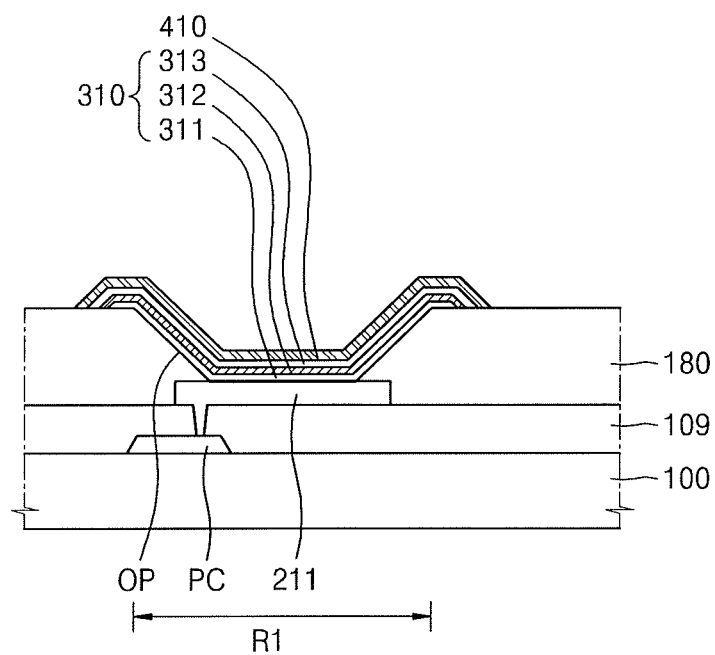

As another embodiment, a first masking pattern 3000' may be a single layer including a negative photosensitive material as illustrated in FIG. 9A. After forming the first masking pattern 3000' including an opening OR1 corresponding to the first pixel region, when forming the first intermediate layer 310 and the first opposite electrode 410 by using the thermal evaporation method, etc. and removing the first masking pattern 3000', a stacked structure of patterned first intermediate layer 310 and first opposite electrode 410 may remain in the first pixel region R1 as illustrated in FIG. 9B. Similarly, a stacked structure of the second intermediate layer 320 and the second opposite electrode 420 may be formed and a stacked structure of the third intermediate layer 330 and the third opposite electrode 430 may be formed.

The first to third opposite electrodes 410, 420, and 430 may include a material having a large work function. For example, the first to third opposite electrodes 410, 420, and 430 may include at least one of Ag, Mg, Al, Yb, Ca, Li, and Au. For example, the first to third opposite electrodes 410, 420, and 430 may include a single layer or multiple layers including at least one of Ag, Mg, Al, Yb, Ca, LiF/Ca, LiF/Al, Al, and Au. As an embodiment, the first to third opposite electrodes 410, 420, and 430 may include a metallic thin film including Ag and Mg. The Ag content may be greater than the Mg content.

The first to third opposite electrodes 410, 420, and 430 may be optically clear electrodes or reflective electrodes. The first to third opposite electrodes 410, 420, and 430 including the above materials may be formed as optically clear electrodes by making the thicknesses thereof to be thin, or may be formed as reflective electrodes by making the thicknesses thereof to be thick. For example, the first to third opposite electrodes 410, 420, and 430 may be formed as optically clear electrodes by forming metal including Ag and Mg to a thickness of about 10 to 15 Å, or may be formed as reflective electrodes by forming metal including Ag and Mg to a thickness to about 50 nm or more.

Referring to FIG. 3 again, the first to third opposite electrodes 410, 420, and 430 spaced apart from each other may be respectively connected by connection electrodes 415, 425, and 435. For example, the first opposite electrodes 410 may be connected to each other by the first connection electrodes 415, the second opposite electrodes 420 may be connected to each other by the second connection electrodes 425, and the third opposite electrodes 430 may be connected to each other by the third connection electrodes 435. For example, in the embodiment shown in FIG. 3, the opposite electrodes of pixels R1 in one row of alternating R1 and R3 pixels may be connected to opposite electrodes of pixels R1 in a next row of alternating R1 and R3 pixels by first connection electrodes 415. The opposite electrodes of pixels R3 in one row of alternating R1 and R3 pixels may be connected to opposite electrodes of pixels R3 in a next row of alternating R1 and R3 pixels by second connection electrodes 435. The opposite electrodes of pixels R2 in a row between rows of alternating R1 and R3 pixels may be connected to each other in the first direction by second connection electrodes 425. The first to third connection electrodes 415, 425, and 435 may partially cross each other in the non-pixel region NR.

The first to third connection electrodes 415, 425, and 435 may be respectively in the same layers as the corresponding first to third opposite electrodes 410, 420, and 430 and may respectively include the same materials as the first to third opposite electrodes 410, 420, and 430. The first connection electrode 415 may be in the same layer as the first opposite electrode 410 and may include the same material as the first opposite electrode 410. The second connection electrode 425 may be in the same layer as the second opposite electrode 420 and may include the same material as the second opposite electrode 420. The third connection electrode 435 may be in the same layer as the third opposite electrode 430 and may include the same material as the third opposite electrode 430.

The first to third connection electrodes 415, 425, and 435 may be respectively formed during the same processes in which the first to third opposite electrodes 410, 420, and 430 are formed. For example, as described with reference to FIGS. 8A to 9B, during a process of forming the first intermediate layer 310 and the first opposite electrode 410, the first masking pattern 3000 may further include an opening region corresponding to the first connection electrode 415, and the first connection electrode 415 may be formed via the additional opening region. The first connection electrode 415 including the same material as the first opposite electrode 410 and formed during the same process as in which the first opposite electrode 410 is formed may be integrally connected to the first opposite electrode 410 A dummy intermediate layer 310d (see FIG. 6) including the same material as the first intermediate layer 310 may be formed together below the first connection electrode 415.

Referring to FIG. 6, the first dummy intermediate layer 310d may be located directly below the first connection electrode 415 and may include an organic material. For example, the first dummy intermediate layer 310d may include a first dummy emission layer 312d of the same material as the first emission layer 312. The first dummy intermediate layer 310d may further include first and second dummy functional layers 311d and 313d of the same materials as the first and second functional layers 311 and 313.

Similarly, a second dummy intermediate layer 320d including the same material as the second intermediate layer 320 may be located below the second connection electrode 425, and a third dummy intermediate layer 330d including the same material as the third intermediate layer 330 may be below the third connection electrode 435. The second dummy intermediate layer 320d and the third dummy intermediate layer 330d may respectively include a second dummy emission layer 322d and a third dummy emission layer 332d, which include organic materials, and may respectively further include at least one of first and second dummy functional layers 321a, 323d, 331d, and 333d.

Referring to FIGS. 3 and 7, at least one of the first to third connection electrodes 415, 425, and 435 may extend toward the peripheral area PA in which the first power line is located, and may be electrically connected to the first power line 10.

The first power line 10 may be located lower than the first to third pixel electrodes 211, 212, and 213 in the organic light-emitting display device. The first to third pixel electrodes 211, 212, and 213 may be located above the first power line 10 with an insulation layer(s) disposed therebetween. For example, the first power line 10 may include the same material as the data line DL described with reference to FIGS. 5A and 5B. In some implementations, the first power line 10 may include the same material as one of the gate electrode G1 of the driving TFT T1, and the first and second storage plates CE1 and CE2 of the storage capacitor Cst.

At least one of the first to third connection electrodes 415, 425, and 435 may be electrically connected to the first power line 10 by a conductive layer 30, which may include a portion above the first to third connection electrodes 415, 425, and 435. When the first connection electrode 415 is formed during the above-described process of manufacturing the first intermediate layer 310 and the first opposite electrode 410, the first dummy intermediate layer 310d may be located below the first connection electrode 415. The first dummy intermediate layer 310d may have substantially the same pattern as the first connection electrode 415. Accordingly, the first connection electrode 415 may be electrically connected to the first power line 10 by the conductive layer 30 above the first connection electrode 415. Similarly, the second and third connection electrodes 425 and 435 may also be electrically connected to the first power line 10 by the conductive layer 30.

Figure 10:
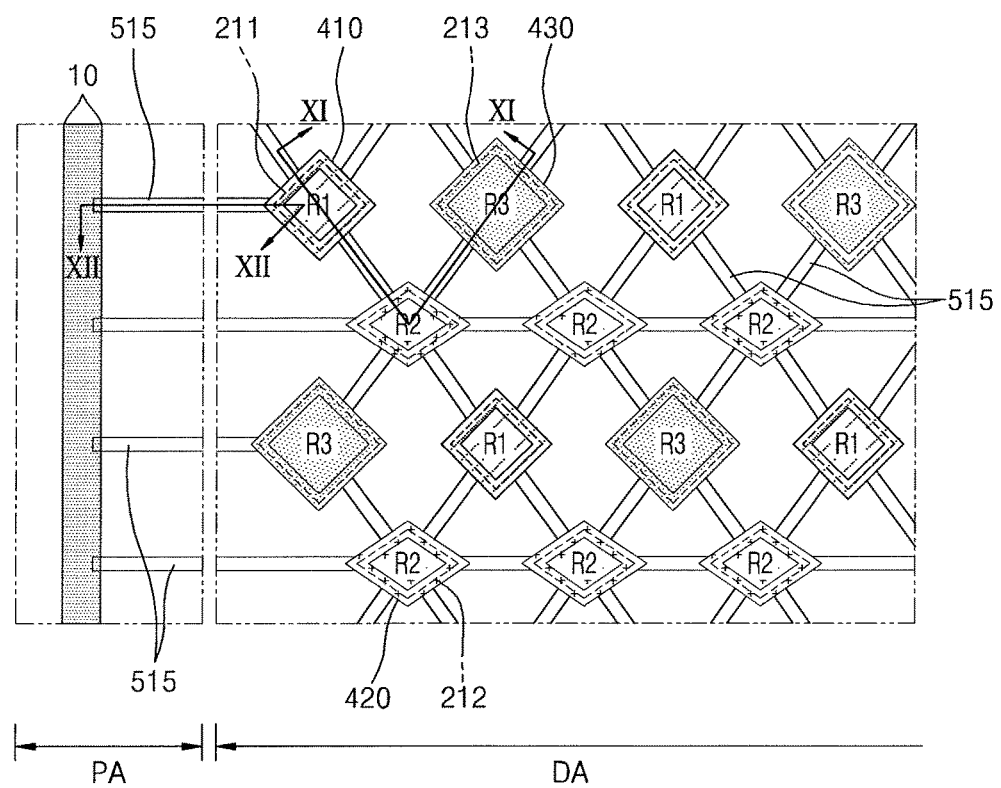
FIG. 10 illustrates a plan view of a portion of an organic light-emitting display device according to another embodiment.
Figure 11:
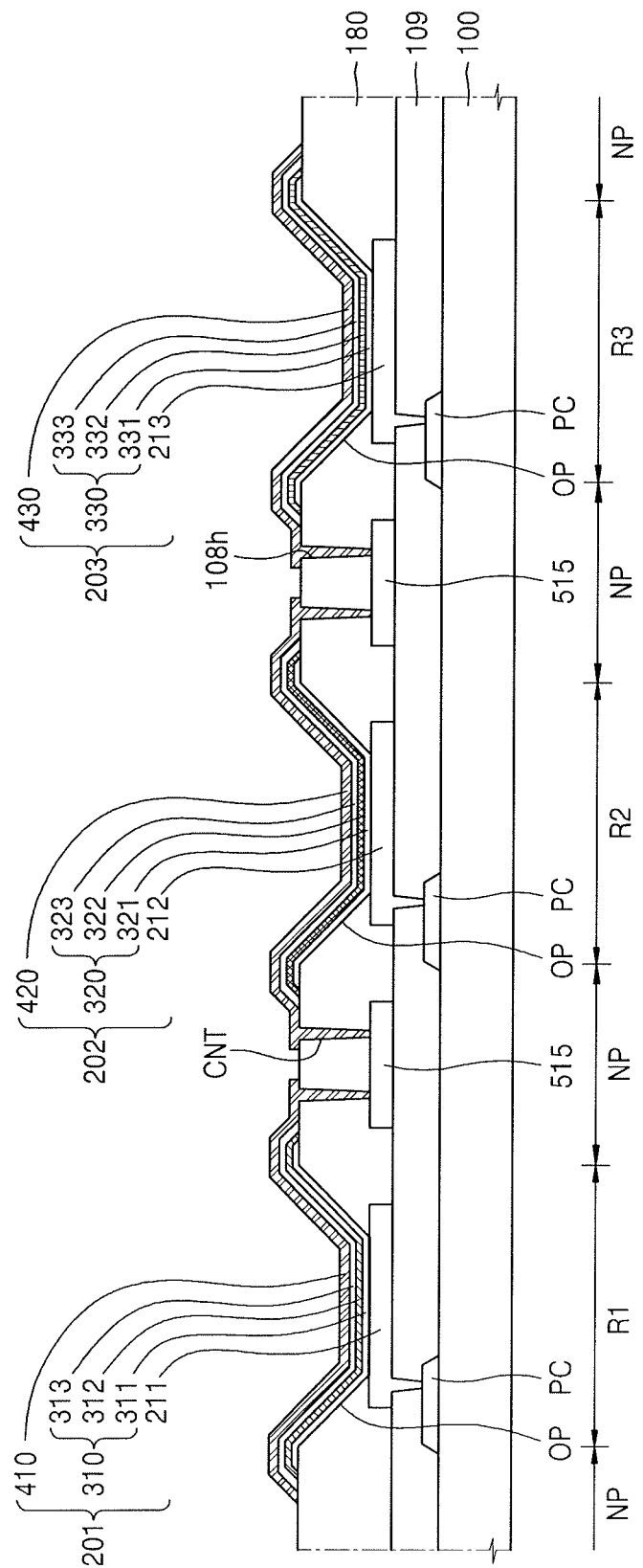
FIG. 11 illustrates a cross-sectional view of a pixel, taken along a line XI-XI of FIG. 10.
Figure 12:
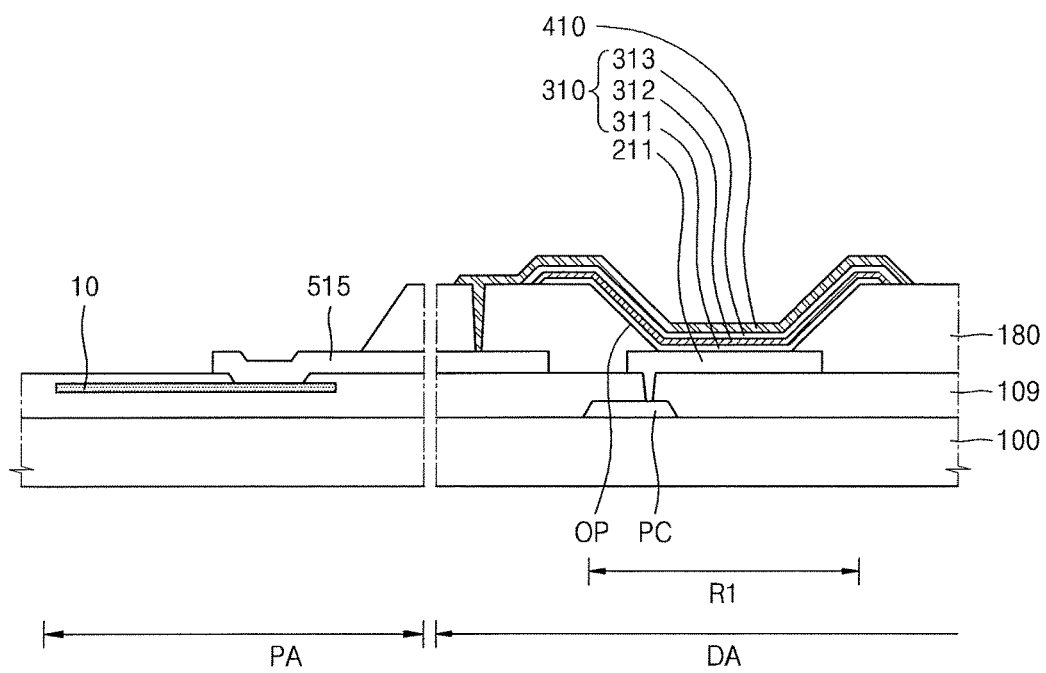
FIG. 12 illustrates a cross-sectional view of a pixel, taken along a line XII-XII of FIG. 10.

FIG. 10 illustrates a plan view of a portion of an organic light-emitting display device according to another embodiment, FIG. 11 illustrates a cross-sectional view of a pixel, taken along a line XI-XI of FIG. 10, and FIG. 12 illustrates a cross-sectional view of a pixel, taken along a line XII-XII of FIG. 10.

Referring to FIGS. 10 and 11, the display area DA may include the first to third pixel regions R1, R2, and R3. The first to third OLEDs 201, 202, and 203 may respectively be in the first to third pixel regions R1, R2, and R3. The first to third OLEDs 201, 202, and 203 are the same as those described with reference to FIGS. 3 and 4. Accordingly, differences are mainly described below.

The first to third opposite electrodes 410, 420, and 430 may be island type electrodes that are spaced apart from each other in the display area DA. The first to third opposite electrodes 410, 420, and 430 spaced apart from each other may be electrically connected by connection electrodes 515. The connection electrodes 515 may be below the pixel-defining layer 180 in the non-pixel region NR.

The first to third opposite electrodes 410, 420, and 430 may be respectively connected to the connection electrodes 515 via contact holes 180h in the pixel-defining layer 180. The connection electrodes 515 may include the same materials as the first to third pixel electrodes 211, 212, and 213.

Referring to FIGS. 10 and 12, at least one of the connection electrodes 515 may extend toward the peripheral area PA in which the first power line 10 is located, and may be electrically connected to the first power line 10. The first power line 10 may be lower than the first to third pixel electrodes 211, 212, and 213 in the organic light-emitting display device. The first power line 10 may include the same material as one of the data line DL, the gate electrode G1 of the driving TFT T1, and the first and second storage plates CE1 and CE2 of the storage capacitor Cst described with reference to FIGS. 5A and 5B. At least one connection electrode 515 may be electrically connected to the first power line 10 by directly contacting the upper surface of the first power line 10.

Although FIGS. 3 and 10 illustrate a case where pixels are arranged with a triangular configuration, it is to be understood that in other embodiments, the pixels may be arranged in a matrix configuration or other various other configurations.

By way of summation and review, in a general organic light-emitting display device, the pixel electrodes have an island shape patterned on a pixel basis but the opposite electrode has one body over a plurality of pixels. However, in such a configuration where an opposite electrode is provided as one body and covers a plurality of pixels, a brightness deviation may occur due to an IR drop by a resistance of the opposite electrode.

Embodiments provide an organic light-emitting display device that includes opposite electrodes patterned on a pixel basis and that facilitates electric connection to a power line providing a common voltage to the opposite electrodes. The occurrence of a brightness deviation may be suppressed by reducing an IR drop and electric connection between power lines may be easily performed.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. An organic light-emitting display device, comprising:
   a substrate including a display area and a peripheral area, the display area including a plurality of pixel regions and non-pixel regions between the pixel regions, and the peripheral area surrounding the display area;
   a plurality of pixel electrodes respectively in the pixel regions, the pixel electrodes being spaced apart from each other in a plan view;
   a pixel-defining layer above the plurality of pixel electrodes, the pixel-defining layer exposing the plurality of pixel electrodes;
   a plurality of intermediate layers respectively above the plurality of pixel electrodes, the intermediate layers including an emission layer;
   a plurality of opposite electrodes spaced apart from each other in a plan view and patterned on a pixel basis such that each opposite electrode of the plurality of opposite electrodes faces a respective one of the plurality of pixel electrodes;
   a plurality of connection electrodes in the non-pixel regions, the connection electrodes connecting the plurality of opposite electrodes; and
   a power line in the peripheral area, the power line being electrically connected to at least one of the plurality of connection electrodes, wherein each of the connection electrodes connects one opposite electrode of the plurality of opposite electrodes with another one of the plurality of opposite electrodes or with the power line, the connection electrodes overlapping only a portion of the pixel defining layer in a plan view.

2. The organic light-emitting display device as claimed in claim 1, wherein the plurality of connection electrodes are above the pixel-defining layer.

3. The organic light-emitting display device as claimed in claim 1, wherein the plurality of connection electrodes include a same material as the plurality of opposite electrodes.

4. The organic light-emitting display device as claimed in claim 1, further comprising:
   a conductive layer connecting at least one connection electrode to the power line, wherein the conductive layer is above the power line and the at least one connection electrode.

5. The organic light-emitting display device as claimed in claim 4, further comprising:
   a dummy intermediate layer below the at least one connection electrode, the dummy intermediate layer including a same material as the intermediate layer.

6. The organic light-emitting display device as claimed in claim 1, wherein:
   the plurality of opposite electrodes include a plurality of first opposite electrodes corresponding to a first pixel region and a plurality of second opposite electrodes corresponding to a second pixel region, and
   the plurality of connection electrodes include a first connection electrode connecting the plurality of first opposite electrodes and a second connection electrode connecting the plurality of second opposite electrodes.

7. The organic light-emitting display device as claimed in claim 6, wherein the first connection electrode crosses the second connection electrode in the non-pixel region.

8. The organic light-emitting display device as claimed in claim 7, further comprising:
   an organic material between the first connection electrode and the second connection electrode.

9. The organic light-emitting display device as claimed in claim 8, wherein the organic material includes a same material as one of a first intermediate layer corresponding to the first pixel region and a second intermediate layer corresponding to the second pixel region.

10. The organic light-emitting display device as claimed in claim 1, wherein the plurality of connection electrodes are below the pixel-defining layer.

11. The organic light-emitting display device as claimed in claim 10, wherein:
   the pixel-defining layer includes contact holes passing through the pixel-defining layer and respectively exposing the plurality of connection electrodes, and
   the plurality of opposite electrodes are connected to the plurality of connection electrodes via the contact holes.

12. The organic light-emitting display device as claimed in claim 1, wherein the plurality of connection electrodes include a same material as the plurality of pixel electrodes.

13. The organic light-emitting display device as claimed in claim 1, wherein:
   the plurality of opposite electrodes include a plurality of first opposite electrodes corresponding to a first pixel region and a plurality of second opposite electrodes corresponding to a second pixel region, and
   at least one of the plurality of connection electrodes connect the first opposite electrodes to the second opposite electrodes.

14. An organic light-emitting display device, comprising:
   a substrate including a display area and a peripheral area, the display area including a plurality of pixel regions and non-pixel regions between the pixel regions, and the peripheral area surrounding the display area;
   a plurality of pixel electrodes respectively in the pixel regions, the pixel electrodes being spaced apart from each other;

a pixel-defining layer above the plurality of pixel electrodes, the pixel-defining layer exposing the plurality of pixel electrodes;

a plurality of intermediate layers respectively above the plurality of pixel electrodes, the intermediate layers including an emission layer;

a plurality of opposite electrodes respectively facing the plurality of pixel electrodes and spaced apart from each other;

a plurality of connection electrodes in the non-pixel regions, the connection electrodes connecting the plurality of opposite electrodes; and a power line in the peripheral area, the power line being electrically connected to at least one of the plurality of connection electrodes, wherein:

the plurality of opposite electrodes include a plurality of first opposite electrodes corresponding to a first pixel region and a plurality of second opposite electrodes corresponding to a second pixel region, the plurality of connection electrodes include a first connection electrode connecting the plurality of first opposite electrodes and a second connection electrode connecting the plurality of second opposite electrodes, and the first connection electrode crosses the second connection electrode in the non-pixel region.

15. The organic light-emitting display device as claimed in claim 14, further comprising:

an organic material between the first connection electrode and the second connection electrode.

16. The organic light-emitting display device as claimed in claim 15, wherein the organic material includes a same material as one of a first intermediate layer corresponding to the first pixel region and a second intermediate layer corresponding to the second pixel region.

17. An organic light-emitting display device, comprising:

a substrate including a display area and a peripheral area, the display area including a plurality of pixel regions and non-pixel regions between the pixel regions, and the peripheral area surrounding the display area;

a plurality of pixel electrodes respectively in the pixel regions, the pixel electrodes being spaced apart from each other;

a pixel-defining layer above the plurality of pixel electrodes, the pixel-defining layer exposing the plurality of pixel electrodes;

a plurality of intermediate layers respectively above the plurality of pixel electrodes, the intermediate layers including an emission layer;

a plurality of opposite electrodes respectively facing the plurality of pixel electrodes and spaced apart from each other;

a plurality of connection electrodes in the non-pixel regions, the connection electrodes connecting the plurality of opposite electrodes; and a power line in the peripheral area, the power line being electrically connected to at least one of the plurality of connection electrodes, wherein each of the connection electrodes is disposed under the pixel-defining layer and connects one opposite electrode of the plurality of opposite electrodes with another one of the plurality of opposite electrodes and with the power line.

18. The organic light-emitting display device as claimed in claim 17, wherein:

the pixel-defining layer includes contact holes passing through the pixel-defining layer and respectively exposing the plurality of connection electrodes, and the plurality of opposite electrodes are connected to the plurality of connection electrodes via the contact holes.

19. The organic light-emitting display device as claimed in claim 17, wherein the plurality of connection electrodes include a same material as the plurality of pixel electrodes.

20. The organic light-emitting display device as claimed in claim 17, wherein:

the plurality of opposite electrodes include a plurality of first opposite electrodes corresponding to a first pixel region and a plurality of second opposite electrodes corresponding to a second pixel region, and at least one of the plurality of connection electrodes connect the first opposite electrodes to the second opposite electrodes.

* * * * *